BINARY COUNTER
Filed Nov. 20, 1963
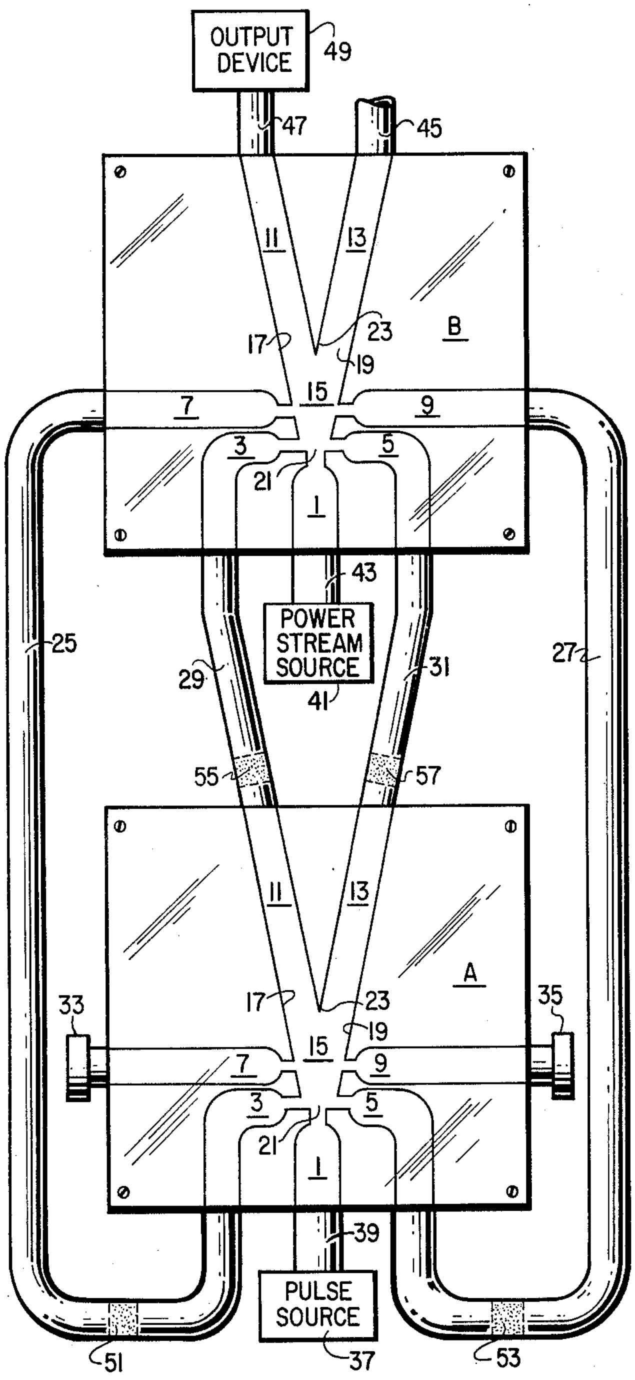
FIG. I
INVENTOR
PETER BAUER
BY Griffin and Stokes
ATTORNEYS 3,219,271

BINARY COUNTER

Peter Bauer, Germantown, Md., assignor to Sperry Rand Corporation, New York, N.Y., a corporation of Delaware Filed Nov. 20, 1963, Ser. No. 324,970
2 Claims. (Cl. 235—201)

The present invention relates to binary counters employing pure fluid amplifiers. More particularly, the present invention relates to improved counters of the type disclosed in Patent No. 3,001,698.

The counters disclosed in the aforementioned patent employ two fluid amplifier components per stage. Both components exhibit a bistable characteristic but, because of an inherent tendency to oscillate, these components must have different configurations. This requires that special components be made in addition to standard bistable amplifier components when the counters described in the patent are incorporated as part of a larger data processing system.

Accordingly, an object of the present invention is to provide an improved counter wherein special components are not required and each counter stage employs two standard bistable amplifiers having either two or four control nozzles.

The manufacturing tolerances for counters of the type described in the above-mentioned patent are quite critical thus increasing production costs.

Therefore, a further object of this invention is to provide economical binary counter stages employing standard fluid amplifier components. This is accomplished by providing two pure fluid amplifiers, one amplifier having its output channels connected to control nozzles of the second. The second amplifier has a further pair of nozzles for sensing the state of the amplifier and these nozzles are connected to control nozzles of the first amplifier for the purpose of producing control signals adjacent the orifice where the power stream enters the first amplifier chamber. The feed-back signals applied to the control nozzles of the first amplifier are of sufficient magnitude to influence the direction of flow of a power stream at the instant the power stream is initiated but are of insufficient magnitude to switch the amplifier from one stable state to the other. The power stream of the second amplifier is continuous but the power stream of the first amplifier is intermittently terminated and then initiated. The control nozzle issuing a control signal at the instant the power stream is initiated determines which state of flow the power stream assumes.

Another object of the invention is to provide a binary counter employing standard bistable amplifiers, said counter being stable and more reliable than counters heretofore known.

An object of the invention is to provide a fluid counter system responsive to sequentially applied fluid pulses for producing alternating fluid pulses, said system comprising: a pair of channels interconected at one end thereof; a first pair of nozzles communicating with said one end; means communicating with said one end for issuing sequential fluid pulses between said nozzles and into said members; a second pair of nozzles connected to the other ends of said channels; a third pair of nozzles connected to said first pair of nozzles; and means for issuing a fluid stream between the nozzles of said second pair and the nozzles of said third pair.

Other objects of the invention and its mode of operation will become apparent upon consideration of the following description and the accompanying drawing.

Referring now to the drawing, a typical counter stage incorporating the principles of the present invention comprises two bistable pure fluid amplifiers A and B. The amplifiers are substantially identical and, for ease of reference, corresponding parts of the two amplifiers are assigned the same reference numeral.

The amplifiers may comprise three flat plates as described in Patent No. 3,001,698. Two plates may be substantially flat and the third plate has formed therein a configuration of channels or nozzles as shown in the drawing. The plate containing the configuration of channels is placed between the flat plates and all plates are held together in a fluid-tight relationship by any suitable fastening means. The plates are illustrated in the drawing as being of a clear plastic material to more easily show the configuration of channels in the center plate. The particular construction described above is by way of illustration only.

Other materials and modes of construction may be employed to produce fluid amplifiers which are equally suitable for use in the present invention.

Each amplifier has a power stream input nozzle 1, a first pair of control nozzles 3 and 5, a second pair of control nozzles 7 and 9 and a pair of output channels 11 and 13. Channels 11 and 13 intersect at one end to form an interaction chamber 15. Walls 17 and 19 of the chamber are offset from the edges of orifice 21 where the power stream nozzle connects with the chamber. Dividing element 23 formed by the intersection of the output channels is located on the center line of orifice 21. As explained in the aforementioned patent, this arrangement provides a bistable amplifier.

Nozzle 7B (nozzle 7 of amplifier B) is connected to nozzle 3A by a tube or other fluid conveying means 25 and nozzle 9B is connected to nozzle 5A by a tube 27. Output channel 11A is connected to nozzle 3B by a tube 29 and output channel 13A is connected to nozzle 5B by a tube 31.

A pulse source 37 intermittently produces fluid pulses which are applied through a tube 39 to power stream nozzle 1A. The pulse source may be a fluid logic element such as a previous counter stage, a solenoid actuated valve, or any other suitable means for intermittently producing fluid pulses to be counted.

Power stream source 41 may be a pump, compressor or other means for applying a substantially constant stream of fluid through tube 43 to power stream nozzle 1B.

The improved binary counter operates in the following manner. When power stream source 41 is turned on a stream of fluid flows through nozzle 1B and orifice 21B and enters the chamber 15B as a high velocity jet stream. If the chamber were perfectly symmetrical in all respects and the pressures on each side of the power jet were exactly equal, the power jet would strike divider 23B and flow in equal amounts into output channels 11B and 13B. However, perfect symmetry is difficult to obtain with mass production techniques so that the power jet tends to move closer to one wall, for instance wall 19B, than to the opposing wall 17B.

The high velocity power jet withdraws molecules of fluid from the regions on each side of its path as it flows through chamber 15B. With the power jet being closer to wall 19B than to wall 17B it is more efficient in withdrawing molecules of fluid from the region between its path and wall 19B than it is in withdrawing molecules from the region between its path and wall 17B. The resulting difference in pressure on the two sides of the power jet bend the jet so that it moves closer to wall 19B. As the jet moves closer to wall 19B it withdraws proportionately less molecules of fluid from the region adjacent wall 17B. This creates an even greater difference in the pressures acting on the two sides of the power jet and it is bent even closer to wall 19B.

The action described above is cumulative and in a very short time the power jet locks on to wall 19B and the entire power jet flows through channel 13B and tube 45. The flow of fluid from tube 45 may be used to actuate an indicator to indicate the state of the amplifier. Amplifier B is considered to be in its "zero" or "reset" state when the power stream emerging from orifice 21B is flowing through output channel 13B.

With the power jet of amplifier B locked on to wall 19B the pressure in nozzles 5B and 9B become lower than the pressures in nozzles 3B and 7B. This tends to induce fluid flow in two parallel paths. In the first path fluid flows from chamber 15B through nozzle 7B, tube 25, nozzle 3A, chamber 15A, nozzle 5A, tube 27B, tube 25, 9B into the low pressure region adjacent wall 19. In the second path fluid flows from chamber 15B through nozzle 3B, tube 29 and channel 11A, then around divider 23A and through channel 13A, tube 31 and nozzle 5B into the low pressure region adjacent wall 19.

The amount of fluid flowing through these paths and entering the low pressure region along wall 19B is determined by the difference in the pressures in nozzles 7B and 9B and nozzles 3B and 5B as well as the resistance to fluid flow through the two paths. As subsequently explained, this resistance may be attained by the use of porous plugs or nozzles and tubes of small cross-sectional area and is chosen such that the velocity and mass flow induced in the two paths is insufficient to unlock the power stream of amplifier B from wall 19B.

Fluid continues to flow through these paths until source 37 produces the first fluid pulse. This pulse emerges from orifice 21 as a high velocity power jet.

At the instant the power jet enters chamber 15A it is acted on by three forces. The first is an unbalanced force resulting from unavoidable dimensional asymmetries of chamber 15A. This force may tend to bend the power jet toward wall 17A or wall 19A depending on the shape of the chamber. The second force is the force exerted by the small fluid stream flowing down channel 11A, around divider 23A, and out channel 13A. This force tends to induce the power jet to flow into channel 13A. The third force is the force exerted by the small fluid stream flowing from nozzle 3A across orifice 21A to nozzle 5A.

The fluid resistance of the two parallel flow paths is chosen such that the forces exerted on the power jet of amplifier A by the fluid flowing through these paths is great enough to overcome the effects of lack of symmetry of chamber 15A. Furthermore, the fluid resistance of the parallel flow paths is chosen such that the fluid flow between channels 11A and 13A and between nozzles 3A and 5A is sufficient to deflect and influence the direction of flow of a power jet as it first begins to emerge from orifice 21A but is insufficient to change the state of amplifier A once the power jet has locked on to one of the walls 17A and 19A.

Therefore, as the power jet first emerges from orifice 21A it is deflected toward wall 19A by the forces exerted by the two small streams of fluid. Once the power jet is deflected closer to wall 19A than to wall 17A it locks on to wall 19A in the same manner as described above with reference to amplifier B.

When the power jet of amplifier A locks on to wall 19A it flows through output channel 13A, tube 31, and nozzle 5, and enters chamber 15B as a high velocity control jet. The control jet supplies fluid to the low pressure region adjacent wall 19B thus increasing the pressure in this region to the point where the power stream flowing through chamber 15B breaks away from the wall and swings toward the center of the chamber. With fluid being supplied to the region adjacent wall 19B through nozzle 5B the pressure on the right side of the power stream is greater than the pressure on the left side. Consequently, the power jet swings toward wall 17B and in doing so withdraws proportionately more molecules of fluid from the region adjacent this wall until it finally locks on to the wall and flows through channel 11B and tube 47 to output device 49. Amplifier B is considered to be in its "one" or "set" state when the power stream emerging from orifice 21B is flowing through output channel 11B.

Output device 49 may be another counter stage similar to the one shown herein, the tube 47 being connected to power stream nozzle 1A of that stage.

When the power stream of amplifier B switches from wall 19B to wall 17B the pressure conditions in nozzles 7B and 9B and nozzles 3A and 5A are reversed. That is, the high velocity power jet flowing along wall 17B reduces the pressures in nozzles 7B and 3B to some value less than the pressures in nozzles 5B and 9B.

The difference in pressures in nozzles 3B and 5B tends to induce a small fluid from nozzle 5B around divider 23A to nozzle 3B. The difference in pressures in nozzles 7B and 9B tends to induce a small fluid flow from nozzle 9B through nozzles 5A and 3A to nozzle 7B. As stated before, the velocity and mass flow induced in these paths is insufficient to switch amplifier A as long as the power stream of this amplifier is flowing. Therefore, if the power jet of amplifier A is still flowing as a result of the first pulse from source 37, the power jet remains locked on to wall 19A despite any flow induced as a result of the pressure differences in the control nozzles of amplifier B.

Amplifier B may be switched from its set state to its reset state by terminating the first pulse from source 37 and then initiating a second pulse. When the second pulse is applied to power stream nozzle 1A it emerges from orifice 21A as a high velocity jet. The flow of fluid from nozzle 5A across the power jet nozzle to nozzle 3A deflects the newly initiated power jet toward 17B. At the same time, the pressure in nozzle 3B is lower than the pressure in nozzle 5B and these pressures result in a lower pressure in channel 11A than in channel 13A thus inducing the power jet to enter channel 11A. After being deflected toward wall 17A the power jet locks on to wall 17A through the action described above.

When the power jet from orifice 21A locks on to wall 17A it flows through channel 11A, tube 29, and nozzle 3B and enters chamber 15B as a high velocity control jet. The control jet feeds fluid to the low pressure region adjacent wall 17B, increasing the pressure in this region until the power jet breaks away from wall 17B and swings toward the center of chamber 15B. With the control jet feeding fluid to the region on the left of the power jet the pressure in this region becomes greater than the pressure on the right side of the power jet. This bends the power jet toward wall 19B and through its own action the jet locks on to wall 19B. The second fluid pulse from source 37 may be terminated any time after the power jet begins to attach itself to the wall.

As the power jet amplifier B locks on to wall 19B it again withdraws fluid from nozzles 5B and 9B into the low pressure region adjacent the wall. Thus, fluid again flows from nozzle 7B to nozzle 9B through nozzles 3A and 5A and from nozzle 3B to nozzle 5B through channels 11A and 13A. All conditions are again the same as before the first pulse was applied to nozzle 1A.

The operating cycle described above is repeated for each two pulses applied to nozzle 1A. The first and succeeding alternate pulses applied to nozzle 1A set amplifier B so that its power jet flows into tube 47. The second and succeeding alternate pulses applied to nozzle 1A reset amplifier B so that its power jet flows into tube 45. Those familiar with the data processing art will recognize this as the action of a modulo-2 or binary counter.

As amplifier B is switched from one state to the other the pressures in control nozzles 3B and 7B or 5B and 9B are suddenly increased or decreased, depending upon whether the amplifier is being set or reset. If the pressure is suddenly increased then a compression wave is created which moves toward the opposing control nozzle by way of one of the parallel control flow paths. If the pressure is suddenly decreased then a rarefaction wave is created which moves toward the opposing control nozzle by way of one of the parallel control flow paths.

For example, as the power jet of amplifier B locks on to wall 17B a compressional wave is produced in nozzle 5B which moves toward nozzle 3B through channels 13A and 11A. At the same time, a rarefaction wave is produced in nozzle 3B which moves toward nozzle 5B over the same path. Also, a rarefaction wave is produced in nozzle 7B and a compression wave in nozzle 9B with these waves travelling the path which includes nozzles 3A and 5A.

If the compression and rarefaction waves were permitted to travel to the opposing nozzles they might cause the power jet issuing from orifice 21B to be switched with each switching operation creating new waves. Thus, amplifier B might oscillate regardless of the presence or absence of input pulses from source 37.

Porous fluid resistances 51, 53, 55, and 57 may be inserted in the paths travelled by these waves to intermix the waves and prevent them from falsely switching amplifier B. Alternatively, the configuration of channels 11A and 13A may be chosen to intermix the waves as explained in the above-mentioned patent.

The advantages of the present invention over counter stages of the prior art may best be understood by assuming that the counter stage shown in the drawing does not have nozzles 3A, 5A, 7B, and 9B or connecting tubes 25 and 27. That is, the drawing shows a typical counter of the prior art if these elements are assumed to be absent and if it is assumed that channels 11A and 13A are designed to intermix the compression and rarefaction waves as described in Patent No. 3,001,698.

With the above assumptions, it may be seen that the following conditions exist in typical counters of the prior art. There are two factors which influence the direction of flow of a power jet as it is first initiated and begins to emerge from orifice 21A. The grst is the effect of unavoidable asymmetry in the region near orifice 21A and in the offset regions. The second is the effect of the proximity and the slight unavoidable asymmetry of dividing element 23A. The closer the dividing element is to orifice 21A the greater its influence is on the power stream.

Following through with the above assumptions consider now the situation where there is a small fluid flow from, for example, channel 11A to 13A around the dividing element 23A as a result of a slight difference in the pressures in nozzles 3B and 5B. What should happen is that this flow should induce the power stream of amplifier A to enter output channel 13A. However, this can be assured only if the influence of the flow between channel 11A and 13A at the instant the power stream leaves orifice 21A is sufficient to overcome the effects of asymmetry. If the influence is too weak the power stream may lock on to wall 17A and enter channel 11A.

The influence may be too weak if the point of the dividing element is too far away from orifice 21A. The relatively small amount of fluid flowing from channel 11A to channel 13A tends to flow rather close to the dividing element at it flows through chamber 15A. There is only a slight flow across orifice 21A at the lower end of the chamber and, in fact, there may even be a region in the lower end of the chamber around orifice 21A where there is no movement of fluid. This indicates that the dividing element should be placed close to orifice 21A but, as explained above, the closer the dividing element is placed to the orifice the greater the influence of its asymmetry on a newly initiated power jet. This influence may be too great to be overcome by the small fluid flow which may be induced as a result of the difference in pressures in nozzles 3B and 5B. Thus, the counter stages of the prior art are very critical dimensionally.

The present invention overcomes this problem by providing control nozzles 3A, 5A, 7B and 9B and connecting tubes 25 and 27. The nozzles 3A and 5A connect with chamber 15A immediately adjacent orifice 21A. With a difference in the pressures in nozzles 7B and 9B there is a small fluid flow between nozzles 3A and 5A and this flow passes directly across orifice 21A so that it begins to deflect a newly initiated power jet at the instant the power jet first emerges from the orifice. Thus, with the present invention a greater force may be exerted on the power jet of amplifier A for a given difference in the pressures on each side of the power jet of amplifier B. This provides greater reliability in that it insures that the power jet of amplifier A is deflected in the desired direction as soon as it emerges from the power stream nozzle.

A further advantage is attained by virtue of the greater influence exerted on the power jet of amplifier A by a small stream of fluid flowing between nozzles 3A and 5A. The small flow around divider 23A is not necessary to insure correct operation. Thus, the resistance to fluid flow in the path extending from nozzle 3B around divider 23A to nozzle 5B may be increased to reduce this flow to a negligible amount without affecting the reliability of the device. The increased fluid resistance also tends to further dampen the compression and rarefaction waves which travel this path. Thus, the walls of channels 11A and 13A need not be specially designed to intermix the waves so amplifier A may be exactly the same as amplifier B. Since the compression and rarefaction waves may be attenuated the dividing element 23A need not extend downwardly as far as in prior art counters to restrict the travel of these waves. As the dividing element is moved upwardly the effects of its asymmetry on the direction of flow of a newly initiated power jet becomes smaller thus increasing switching reliability.

There is an upper limit on the amount of fluid resistance which may exist in the path between channel 11A and nozzle 3B and in the path between channel 13A and nozzle 5B. The fluid resistances 55 and 57 should be chosen such that when the power jet of amplifier A is applied to channel 11A or 13A it causes fluid to enter chamber 15B from nozzle 3B or 5B in an amount sufficient to switch amplifier B from one state to the other.

Amplifier A is shown as having control nozzles 7 and 9 capped by plugs 33 and 35. In actual practice it may be desirable to remove either one or both of these plugs and connect the nozzles to sources of fluid control signals for the purpose of setting the counter to one or the other of its stable states. Alternatively, amplifier A may be constructed without either or both of the nozzles 7 and 9.

While a preferred embodiment of the invention has been shown and described herein, the basic concept may be employed in other embodiments falling within the spirit and scope of the invention. For example, bistable memory elements of the type disclosed in Patent No. 3,001,698 may be employed to obtain the bistable characteristic exhibited by the amplifiers described herein. It is intended therefore to be limited only by the scope of the appended claims.

The embodiments of the invention in which an exclusive property or privilege is claimed are defined as follows:

1. A binary counter comprising: first and second fluid amplifiers each having a pair of output channels interconnected at one end to form a chamber, a power stream nozzle terminating at an orifice in said chamber, the walls of said chamber being offset from said orifice and diverging from each other so that a power stream emerging from said orifice locks onto the wall toward which it is directed, and a pair of oppositely disposed control nozzles for selecting directing said power stream toward one or the other of said walls; a further pair of nozzles communicating with the chamber of said second amplifier; a first and a second plurality of fluid conducting means, said first plurality of fluid conducting means connecting said control nozzles of said first amplifier to said further nozzles of said second amplifier and said second plurality of fluid conducting means connecting the output channels of said first amplifier to the control nozzles of said second amplifier; means for intermittently applying fluid to the power stream nozzle of said first amplifier; and means for continuously applying a stream of fluid to the power stream nozzle of said second amplifier, said oppositely disposed control nozzles of said first amplifier communicating with the chamber of said first amplifier on opposite sides and in proximity to the power stream orifice of the first amplifier whereby the direction of fluid flow between said control nozzles of said first amplifier at the time a power stream begins to issue from said orifice determines the wall to which said power stream is directed, said first fluid conducting means comprising means for limiting the flow of fluid to the control nozzles of said first amplifier to an amount sufficient to deflect a power stream as the power stream is initiated but less than the amount required to unlock a power stream from one of said walls.

2. A binary counter comprising: a first bistable amplifier having a first interaction chamber shaped such that a first power jet injected into said chamber is selectively attached to first or second opposing walls of said chamber; first and second nozzles having orifices in said first and second walls, respectively, for selectively switching said power jet to said second and first walls, said power jet entraining fluid from said chamber to thereby create a difference in the pressures at said first and second walls; third and fourth nozzles terminating at orifices in said first and second walls, respectively; a second bistable amplifier having a second interaction chamber shaped such that a second power jet injected into it is selectively attached to third and fourth opposing walls of said second chamber by pressures created therein by said second jet; fifth and sixth nozzles termniating at orifices in said third and fourth walls respectively; means for continuously injecting a power jet into said first chamber between said first and second walls; means for intermittently injecting a second power jet into said second chamber between said third and fourth walls, the orifices of said fifth and sixth nozzles being positioned whereby fluid flowing between them flows through the region where said second power jet is injected into said second chamber; first and second output means connected to said first and second nozzles, said output means being connected to said second chamber to receive said power stream when it is attached to said third and fourth walls, respectively; and means connecting said third nozzle to said fifth nozzle and said fourth nozzle to said sixth nozzle whereby fluid signals may flow from one side of said first jet to the other side thereof through the region where said second jet is injected into said second chamber said means connecting said third and fifth and fourth and sixth nozzles comprising means limiting the magnitude of fluid signals passing through the region where said second power jet is injected, said magnitude being sufficient to control the attachment of said second power jet to said third or fourth walls, as said jet is initiated but insufficient to detach said second power jet from either said third or said fourth wall.

References Cited by the Examiner

UNITED STATES PATENTS

| | | | |
|---|---|---|---|
| 3,001,698 | 10/1960 | Warren | 235—201 |
| 3,075,548 | 1/1963 | Horton | 235—201 |
| 3,098,504 | 7/1963 | Joesting | 137—81.5 |
| 3,114,390 | 12/1963 | Glattli | 235—201 X |
| 3,117,593 | 1/1964 | Sowers | 235—201 |

FOREIGN PATENTS

| | | |
|---|---|---|
| 1,278,781 | 11/1961 | France. |

OTHER REFERENCES

R. E. Norwood: "Generating Timed Pneumatic Pulses," IBM Technical Disclosure Bulletin, vol. 5, No. 9, February 1963.

LEO SMILOW, *Primary Examiner.*